US011322400B2

(12) United States Patent
von Koblinski et al.

(10) Patent No.: US 11,322,400 B2
(45) Date of Patent: May 3, 2022

(54) ROUGHENING OF A METALLIZATION LAYER ON A SEMICONDUCTOR WAFER

(71) Applicant: Infineon Technologies AG, Neubiberg (DE)

(72) Inventors: Carsten von Koblinski, Villach (AT); Tobias Polster, Villach (AT)

(73) Assignee: Infineon Technologies AG, Neubiberg (DE)

( * ) Notice: Subject to any disclaimer, the term of this patent is extended or adjusted under 35 U.S.C. 154(b) by 20 days.

(21) Appl. No.: 16/906,586

(22) Filed: Jun. 19, 2020

(65) Prior Publication Data

US 2020/0402851 A1 Dec. 24, 2020

(30) Foreign Application Priority Data

Jun. 21, 2019 (EP) .................................... 19181774

(51) Int. Cl.
*H01L 21/768* (2006.01)
*H01L 21/3213* (2006.01)
*H01L 23/31* (2006.01)
*H01L 23/528* (2006.01)

(52) U.S. Cl.
CPC .. *H01L 21/76886* (2013.01); *H01L 21/32134* (2013.01); *H01L 21/32139* (2013.01); *H01L 23/3157* (2013.01); *H01L 23/528* (2013.01)

(58) Field of Classification Search
CPC .................................................. H01L 21/3213
See application file for complete search history.

(56) References Cited

U.S. PATENT DOCUMENTS

| 9,028,666 | B2* | 5/2015 | Ranjan | H01L 21/76879 |
| | | | | 205/137 |
| 10,648,097 | B2* | 5/2020 | Velmurugan | H01L 21/76861 |
| 2004/0256245 | A1 | 12/2004 | Wang | |
| 2013/0196506 | A1 | 8/2013 | Kosub | |
| 2013/0299968 | A1 | 11/2013 | Lin et al. | |
| 2014/0224661 | A1* | 8/2014 | Spurlin | C25D 5/611 |
| | | | | 205/83 |
| 2014/0262803 | A1* | 9/2014 | Ahmed | C25D 21/04 |
| | | | | 205/143 |

FOREIGN PATENT DOCUMENTS

WO 03088316 A2 10/2003

* cited by examiner

*Primary Examiner* — Mounir S Amer
(74) *Attorney, Agent, or Firm* — Murphy, Bilak & Homiller, PLLC

(57) ABSTRACT

A method of manufacturing a semiconductor wafer having a roughened metallization layer surface is described. The method includes immersing the semiconductor wafer in an electrolytic bath. Gas bubbles are generated in the electrolytic bath. A surface of a metallization layer on the semiconductor wafer is electrochemically roughened in the presence of the gas bubbles by applying a reversing voltage between the metallization layer and an electrode of the electrolytic bath.

12 Claims, 4 Drawing Sheets

ROUGHENING OF A METALLIZATION LAYER ON A SEMICONDUCTOR WAFER

TECHNICAL FIELD

This disclosure relates generally to the field of semiconductor wafer manufacturing, and in particular to the field of generating a roughened metallization layer on a semiconductor wafer.

BACKGROUND

The surface finish of a wafer metallization layer is of importance in various aspects of semiconductor device manufacturing. While a low surface roughness of a metallization layer improves the quality of wire bonding on the metallization layer and facilitates optical inspection of the metallized wafer, high roughness is favorable for obtaining high adhesive strength between the metallization layer and an encapsulation applied during packaging. Therefore, metal deposition parameters as well as subsequent surface roughening have been considered in the past to control the roughness of a metallization layer surface on a wafer.

SUMMARY

According to an aspect of the disclosure, a method of manufacturing a semiconductor wafer having a roughened metallization layer surface is described. The method comprises immersing the wafer in an electrolytic bath. Gas bubbles are generated in the electrolytic bath. A surface of the metallization layer on the wafer is electrochemically roughened in the presence of the gas bubbles by applying a reversing voltage between the metallization layer and an electrode of the electrolytic bath.

According to another aspect of the disclosure, a semiconductor wafer metallization layer surface roughening equipment comprises an electrolytic bath. The equipment further comprises a first electrode and a second electrode, the first electrode and the second electrode are configured to be connected to a reversing voltage, wherein at least one of the first electrode and the second electrode is a metallization layer on the wafer. A first gas bubble generator is configured to treat the metallization layer with gas bubbles during electrochemical roughening.

According to still another aspect of the disclosure, a semiconductor package comprises a semiconductor die having a metallization layer. The metallization layer comprises a roughened surface. The semiconductor package further comprises an encapsulation embedding at least partially the semiconductor die and the roughened surface of the metallization layer, wherein the roughened surface has a roughness of a root mean square height of equal to or greater than 300 nm, 400 nm, 500 nm, 600 nm, 700 nm, or 800 nm.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other and/or can be omitted if not described to be necessarily required. Embodiments are depicted in the drawings and are exemplarily detailed in the description which follows.

DETAILED DESCRIPTION

Figure 1:
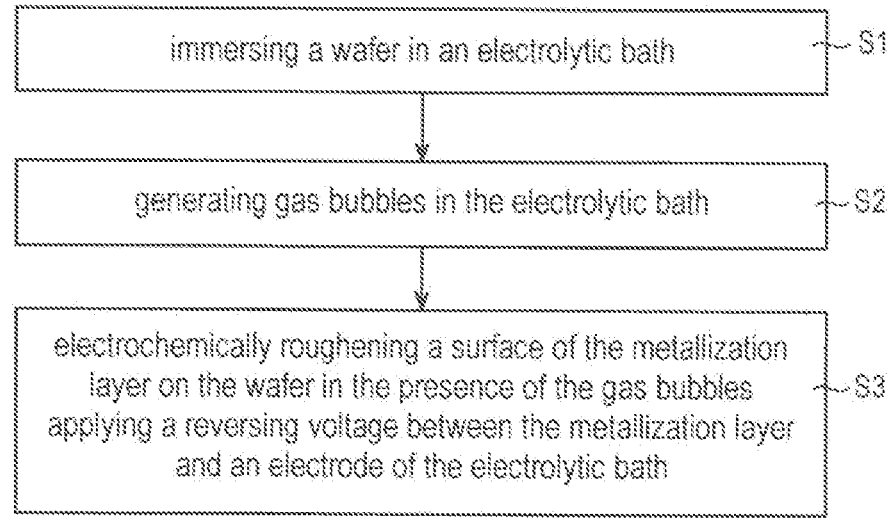
FIG. 1 is a flowchart schematically illustrating an exemplary method of manufacturing a semiconductor wafer having a roughened metallization layer surface.

It is to be understood that the features of the various exemplary embodiments and examples described herein may be combined with each other, unless specifically noted otherwise.

In many applications metal layers are deposited on semiconductor wafers. The process of depositing one or more metal layers on one or more surfaces of the wafer is also referred to as applying a metallization layer to the wafer or, briefly, as metallizing the wafer. The wafer metallization layer may provide for electrodes (i.e. die pads) on the wafer and/or may provide for an efficient thermal coupling of the wafer to a heat sink or other heat dissipation tools.

The semiconductor wafers considered herein may be front-end processed, i.e. integrated circuits (ICs) may be monolithically integrated in each of the semiconductor wafer regions destined to be cut out of the semiconductor wafer to form a die. The ICs may represent power ICs, logic ICs, optical ICs, MEMS (micro-electro-mechanical systems) ICs, etc. In particular, the ICs may include or form power transistors, power diodes, or other power circuitry.

The generation of the metallization layer may be performed in various ways, e.g. by electroplating (i.e. galvanic deposition) or by electroless plating (i.e. non-galvanic deposition) or other deposition techniques. In particular in power applications, the metallization layer may be relatively thick, e.g. may have a thickness of equal to or greater than 0.5 µm, 1.0 µm, 2.0 µm, 5.0 µm, 10 µm, or 20 µm. The metallization layer may substantially cover the entire area of one or both main surfaces of the semiconductor wafer or may cover a part (e.g. equal to or more than or less than 20%, 40%, 60%, 80%) of the area on one or both wafer surfaces.

The metallization layer may be unstructured or structured. If being structured, electrodes, die pads, conductive traces, or other conductive metal structures or patterns may have already been formed out of the metallization layer by, e.g., lithography or processes including, e.g., resist patterning and/or masking and/or etching, etc.

As mentioned above, surface properties of the metallization layer may play an important role in subsequent manufacturing processes and can be controlled by a variety of parameters. More specifically, the smoothness (or roughness) of a metallization layer surface may be controlled by the metal deposition process as such. Another possibility to control the smoothness (or roughness) of the metallization layer surface is to apply a certain post-treatment to this surface after metal deposition has been completed, e.g. a smoothing treatment or a roughening treatment.

At least for certain areas of the metallization layer surface a high degree of roughness can be desirable. The rougher the surface the better is the adhesive strength between the metallization layer and other layers applied later on to the metallization layer. In particular, a high roughness of the metallization layer may improve the adhesive strength between the metallization layer and organic materials applied on the metallization layer. Such organic materials may, e.g. be mold compounds or laminates used for an encapsulation during packaging and/or conductive adhesive materials which may, e.g., be used as an electrical coupling between the metallization layer and external terminals of a semiconductor package.

Referring to FIG. 1, a method of manufacturing a semiconductor wafer having a roughened metallization layer surface is described by way of example. At S1, the semiconductor wafer is immersed in an electrolytic bath. At S2, gas bubbles are generated in the electrolytic bath. Then at S3, a surface of the metallization layer on the semiconductor wafer is electrochemically roughened in the presence of the gas bubbles by application of a reversing voltage between the metallization layer and an electrode of the electrolytic bath.

As will be described in more detail further below, this process of wet-chemical roughening of the surface of the metallization layer allows to enhance the roughness of the surface to achieve a degree of roughness which is considerably higher than known from conventional roughening processes. Further, the process of wet-chemical roughening described herein provides for a high degree of controllability and reproducibility of the obtained surface properties (in particular the roughness of the surface). Further, the roughening treatment described herein is compliant with conventional semiconductor processing and can therefore be implemented in the wafer manufacturing process without any major obstacles.

Figure 2:
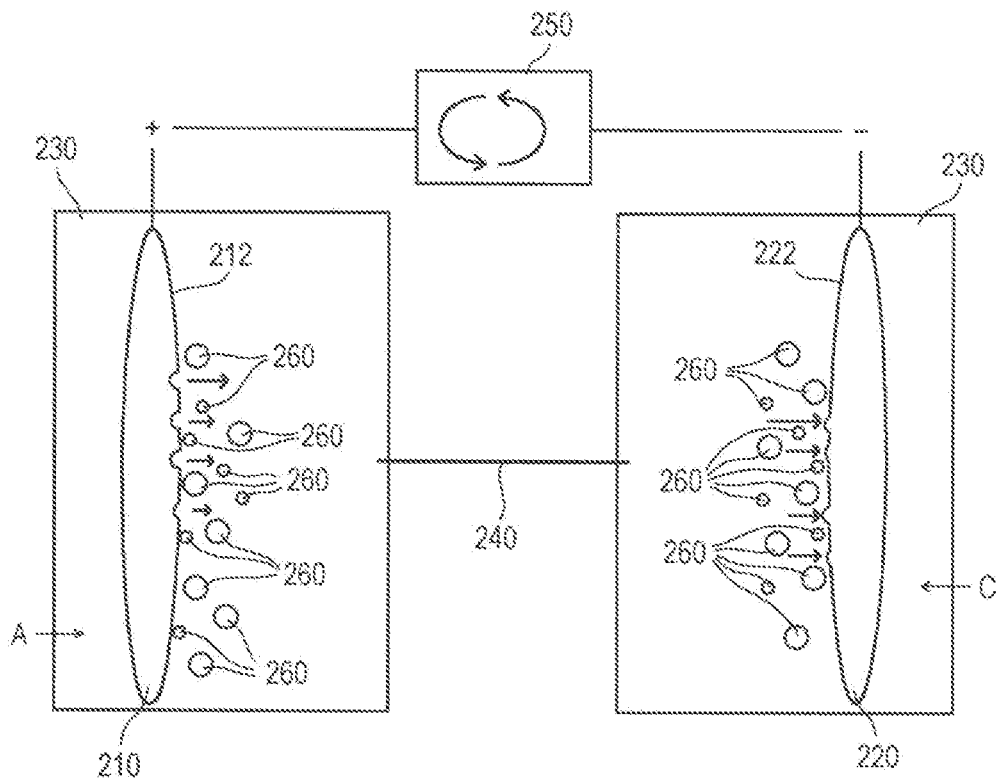
FIG. 2 is a schematic illustration of an anode reaction and a cathode reaction during electrochemical roughening of a metallization layer surface on a wafer in an electrolytic bath.

FIG. 2 is an illustration of chemical reactions taking place at an anode A and at a cathode C during electrochemical roughening in an electrolyte 230 of an electrolytic bath. The anode A is electrically coupled to a positive potential of a reversing voltage power supply 250, while a cathode C is electrically coupled to a negative potential of the reversing voltage power supply 250. Since the reversing voltage power supply 250 provides for reversing polarity (i.e. for an alternating current flowing through the electrolytic bath), FIG. 2 represents a "snapshot", i.e. when reversing the voltage output at the reversing voltage power supply 250 the anode A in FIG. 2 becomes the cathode C and the cathode C in FIG. 2 becomes the anode A. The electrolyte 230 at the cathode C and the electrolyte 230 at the anode A are electrically coupled by schematically indicated coupling 240 to allow an electric current flow. The coupling 240 may be implemented by the electrolyte 230 contained in a (common) electrolytic bath or by an electrical connector connecting the electrolyte 230 at the cathode C with the separated electrolyte 230 at the anode A.

In FIG. 2 both the anode A and the cathode C are formed by metallization layers 212 and 222 on semiconductor wafers 210 and 220, respectively. When biased as an anode A, metal of the metallization layer 212 is removed from the metallization layer 212 (see the arrows pointing away from 212) and dissolved in the electrolyte 230. On the other hand, metal from the electrolyte 230 is deposited to the same amount on the metallization layer 222 of the wafer 220 biased as a cathode (see the arrows pointing towards 222). After reversal of the polarity at the reversing voltage power supply 250, the process reverses at the semiconductor wafers 210, 220, i.e. metal from the electrolyte 230 is deposited on the metallization layer 212 of the wafer 210 and metal from the metallization layer 222 of the wafer 220 is removed and transferred into the electrolyte 230.

Generally, the metallization layer(s) 212, 222 may be based on a metal or a metal alloy of, e.g., Cu, Ni, NiP, Au, Zn, Al, etc. In the following, for the purpose of explanation and without loss of generality, Cu is used as an example of the metal of the metallization layer. The wafer(s) 210, 220 may comprise or be of a semiconductor material such as, e.g., Si, SiC, SiGe, GaAs, GaN, AlGaN, InGaAs, InAlAs, etc.

Further, as indicated in FIG. 2, the cathode reaction and (optionally) the anode reaction is carried out in the presence of gas bubbles 260. The gas bubbles 260 impede a uniform deposition of metal at the cathode C, thereby creating the desired roughness of the surface of the metallization layer 222. Metal deposition at the cathode C may, e.g., also be partly or completely a metal re-deposition, since, e.g., virtually all deposited metal may have been removed from the metallization layer 222 during the time before when the metallization layer 222 was biased as an anode A.

The uniformity of the roughness can be controlled by the gas bubbles 260. The smaller the average size of the gas bubbles 260, the better is the uniformity of the roughness. Differently put, gas bubbles 260 may act to form a temporary and statistically distributed micro-masking of the surface of the metallization layer 222 during the electrochemical dissolution and deposition process on the surface of the metallization layer 222.

Generally, the uniformity of the roughness obtained by using a stream of gas bubbles 260 in the immediate vicinity of the surface of the metallization layer 222 is significantly better than the uniformity of a "natural" surface roughness which may occur in a conventional electrolytic bath. As known in the art, the generation of such "natural" roughness at a surface of the metallization layer 222 can be prevented by specific additives, which are usually added to the electrolytic bath to avoid the generation of such "natural" surface roughness. The "natural" surface roughness (obtained without gas bubbles and without additives) is caused by variations in the conditions of the metallization layer surface which result in different deposition rates. It is characterized by a high degree of inhomogeneity and therefore cannot be used for the purposes described herein, e.g. for reliably improving the adhesive strength between the roughened metallization layer and, e.g., an encapsulation.

While FIG. 2 exemplifies both electrodes (the anode A and the cathode C) to be implemented by metallization layers 212, 222 of wafers 210, 220, respectively, it is also possible that only one electrode is formed by a wafer metallization layer, while the other electrode is implemented by other means, e.g. by a metal plate immersed in the electrolytic bath. In this case, by virtue of the polarity reversal of the reversing voltage power supply 250, the same processes as illustrated in FIG. 2 take place at the metallization layer of the wafer and the same results are achieved. The metal plate forming the other electrode does not even have to be made of the metal of the (wafer) metallization layer but may be made of an inert electrode material, since the process described herein may, e.g., completely rely on the re-deposition of metal (during the cathode reaction) which has been previously removed from the metallization layer (during the anode reaction).

More specifically, the entire electrochemical roughening process may be performed without any depletion of metal ions in the electrolyte 230. In contrast to conventional electrochemical deposition processes, in which the electrolyte is depleted during deposition and therefore needs to be regenerated from time to time, electrolyte regeneration is not required during electrochemical roughening as described herein.

Differently put, the concentration of metal ions (of the metal of the metallization layer(s) 212, 222) in the electrolyte 230 may be constant over time (i.e. no depletion and no enrichment of metal ions in the electrolyte 230 over the entire process, in particular e.g. at any time during the process). Constant metal ion concentration may be achieved by applying a reversing voltage configured to set the anode reaction and the cathode reaction to equal rates.

The gas used to generate the gas bubbles 260 may be an inert gas or an oxidizing gas or a reducing gas or a mixture of any of those gases. Inert gases such as, e.g., $N_2$ or Ar merely exert a "masking effect" on the deposition (or re-deposition) of the metal during the cathode reaction. "Masking effect" means that each bubble 260 locally prevents deposition (or re-deposition) of metal at the location where the gas bubble 260 is temporarily in contact with the surface of the metallization layer 222.

Reducing gases such as, e.g., $N_2H_2$, CO or oxidizing gases such as, e.g., air or $O_2$, further act as a reaction agent during the cathode reaction and (optionally) during the anode reaction. In the cathode reaction the gas reacts with the metal which has just been deposited on the surface. Metal oxide secondary products (if an oxidizing gas is used) will be incorporated in the metallization layer 222 near its surface. For instance, if an oxidizing gas is used, it is possible that the surface of the metallization layer 222 is locally and partly or even completely insulated by the creation of punctual or extensive and/or continuous areas of metal oxide.

An extensive and continuous layer of metal oxide may even form an insulating layer on the roughened surface of the metallization layer 222 which may completely cover and electrically insulate the metallization layer 222. In other words, in addition to the effect of uniformly roughening the surface of the metallization layer 222, the gas bubbles 260 may further be used to generate functionalized surface(s) of the metallization layer(s) 212, 222.

Further, there is the option to mask certain areas of the metallization layer before emerging the wafer in the electrolytic bath so as to prevent roughening of the masked areas. As the roughening process described herein may be carried out in a material-neutral manner, i.e. the roughening process does not require any additional metal material for deposition, the mean metallization layer thickness may remain unchanged and/or the masked smooth areas and the roughened areas may remain on the same average level.

Further, the approach of masking may also or additionally be applied within the concept of functionalizing the surface of the metallization layer 222. That is, it is possible that, e.g., a first mask is used to define a pattern of smooth and roughened surface areas and/or a second mask is used to define a pattern of chemically functionalized and non-functionalized surface areas of the metallization layer 222. To this end, it may be possible to first roughen the surface of the metallization layer without functionalizing the roughened surface areas and then to apply a second mask (which may be different from the first mask) to the pre-roughened surface in order to functionalize certain areas of the pre-roughened surface of the metallization layer 222.

In this and other cases, it is possible that a plurality of different gases is used during the roughening process. For instance, if a pattern of functionalized surface areas is to be created, the process may start with the introduction of an inert gas for roughening without functionalizing the surface and may then, e.g. after a masking step, continue with e.g. an oxidizing gas or a reducing gas for functionalizing the unmasked portions of the roughened surface.

Figure 3:
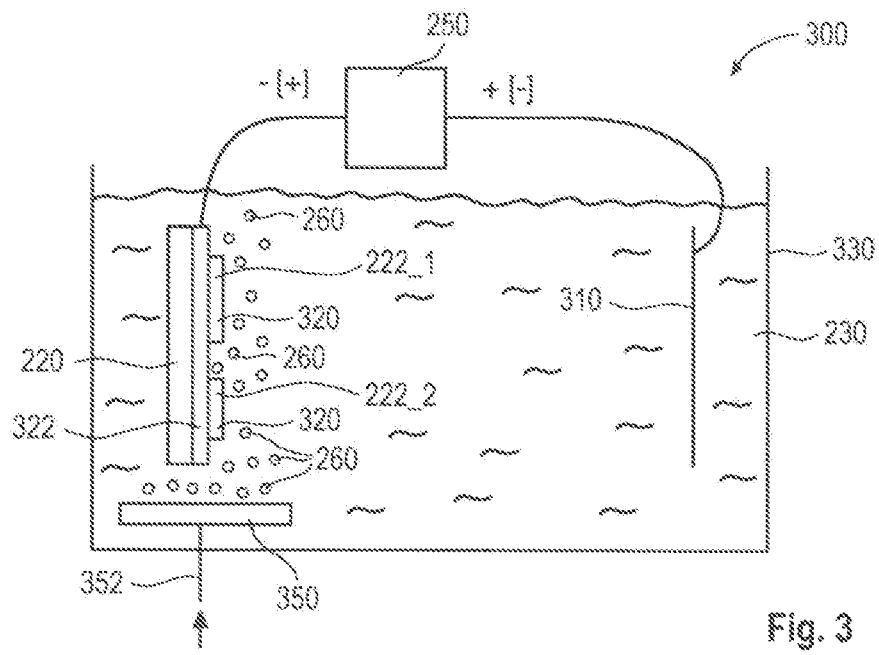
FIG. 3 is a schematic illustration of an example of an equipment for electrochemical roughening a metallization layer surface on a wafer.
Figure 4:
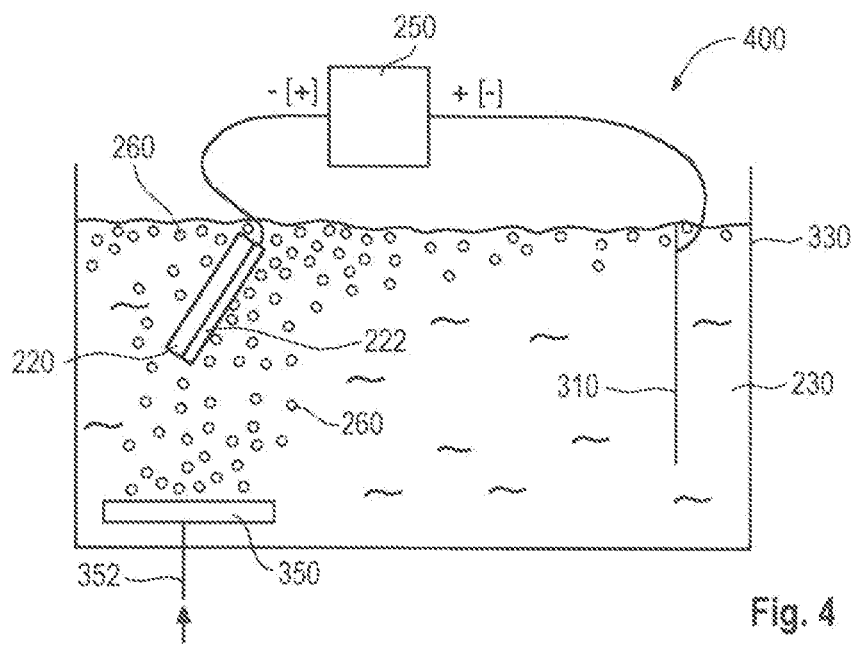
FIG. 4 is a schematic illustration of another example of an equipment for electrochemical roughening a metallization layer surface on a wafer.
Figure 5:
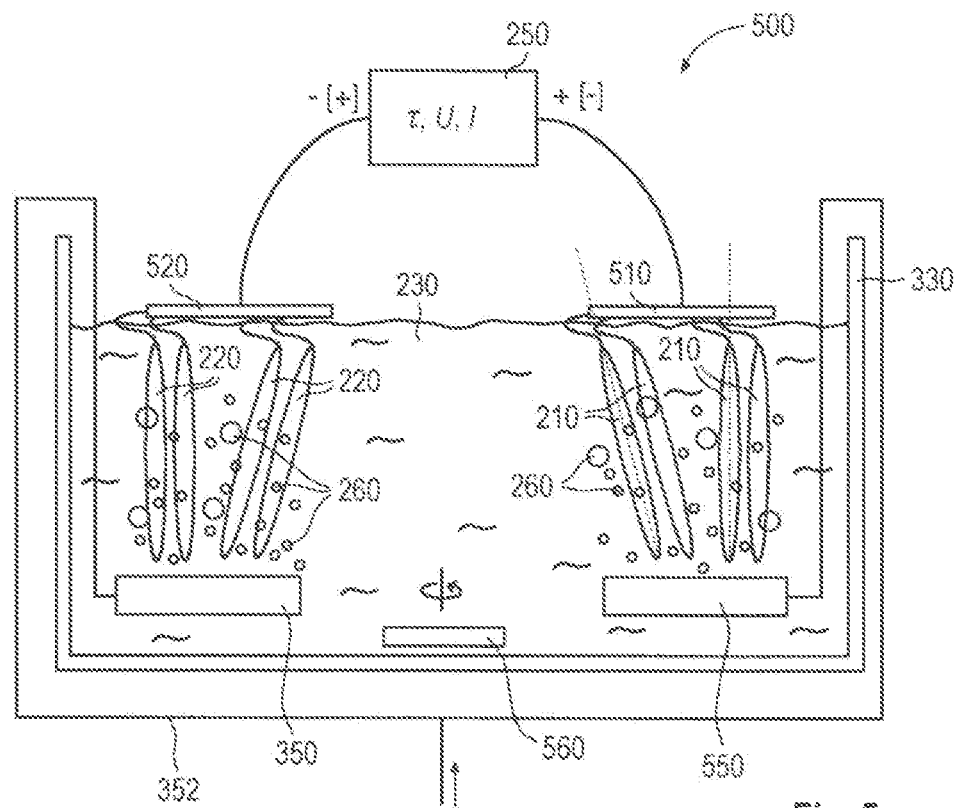
FIG. 5 is a schematic illustration of still another example of an equipment for electrochemical roughening a metallization layer surface on a wafer.

FIGS. 3 to 5 illustrate various examples of an equipment for electrochemical roughening a metallization layer surface on a semiconductor wafer. All process features and variants described above may be applied to any of the examples of FIGS. 3 to 5. Further, specific features of the process or the equipment for roughening a metallization layer surface as disclosed in the following description can be combined with any of the features disclosed in conjunction with the description of FIGS. 1 and 2 or other examples throughout this specification.

Referring to FIG. 3, an equipment 300 for roughening a metallization layer surface 222 on a semiconductor wafer 220 comprises an electrolytic bath 330 containing the electrolyte 230. A first electrode 310 and a second electrode 320 are immersed in the electrolytic bath 330. The first electrode 310 and the second electrode 320 are configured to be connected to a reversing voltage from a reversing voltage power supply 250. At least one of the first electrode 310 and the second electrode 320—in the example of FIG. 3 the second electrode 320—is the metallization layer 222 on the semiconductor wafer 220. Further, the equipment 300 includes a first gas bubble generator 350 which is configured to treat the metallization layer 222 with gas bubbles 260 during electrochemical roughening.

The first gas bubble generator 350 may be configured to generate a stream or "curtain" of fine gas bubbles 260 from a gas flow obtained via a supply line 352 connected to a gas reservoir (not shown). The first gas bubble generator 350 may comprise or be a gas diffusor. The gas diffusor may include a gas diffusor nozzle panel configured to generate a dense gas bubble stream across a sufficiently large cross-sectional area in the electrolytic bath 330. The dense gas bubble stream may have a cross-sectional area sufficient large to completely embed the metallization layer 222 on the wafer 220.

As shown in FIG. 3, the metallization layer 222 on the wafer 220 may be structured. If the metallization layer 222 is structured in separated areas 222_1, 222_2, the separated areas 222_1, 222_2 may be electrically connected. For example, the electrical connection between the area 222_1 of the metallization layer 222 and the area 222_2 of the metallization layer 222 may be provided by an underlying electrically conductive layer 322, e.g. a seed layer used during the metallization process.

The reversing voltage (e.g. an AC voltage) between the metallization layer 222 and the electrode 310 of the electrolytic bath 330 may be applied over a number of cycles. The cycle duration (which is the duration between consecutive reversals of the power supply) may be equal to or greater than 5 s, 10 s, 20 s, 30 s, or 40 s. The number of cycles may be equal to or greater than 5, 10, or 20. The voltage may, e.g., be in a range of 1 to 10 V, in particular 1.5 to 5 V and more in particular 2 to 4 V.

That is, a certain current I or a certain voltage U is predetermined for a certain period τ (cycle duration) during which the cathode reaction is carried out at one of the electrodes (e.g. in FIG. 3 the second electrode 320). Then, the voltage is reversed and the anode reaction is carried out for, e.g., the same period of time T. The current or the voltage during the anode reaction may be of the same amount than during the cathode reaction.

The voltage reversal may be periodical. The reversing voltage power supply 250 may be an AC (alternating current) power supply. The reversing voltage frequency used by the reversing voltage power supply 250 may, e.g., be equal to or less than 1 Hz, 0.5 Hz, 0.2 Hz, 0.1 Hz, 0.05 Hz, or 0.02 Hz.

While in FIG. 3 the orientation of the wafer 220 may be parallel to the direction of the gas bubble stream, it is also possible that the semiconductor wafer 220 is held inclined relative to the direction of movement of the gas bubbles 260 in the electrolytic bath 330. An inclined orientation of the semiconductor wafer 220 relative to the stream of gas bubbles 260 is illustrated in FIG. 4 illustrating another equipment 400 for electrochemical roughening a metallization layer surface on a semiconductor wafer 220.

Further, still referring to FIG. 4, the metallization layer 222 may be positioned in a region of the electrolytic bath 330 where the gas bubbles 260 render the electrolytic bath 330 foamy. As foam formation may mostly occur near the surface of the electrolytic bath 330, the wafer 220 may be positioned near the surface of the electrolyte 230 of the electrolytic bath 330. Therefore, in contrast to conventional wet-chemical electrolytic applications, where foam formation needs typically to be avoided, surface roughening in accordance with this disclosure may specifically use the formation of foam to support the roughening process.

It has been observed that the more foam is formed in the electrolyte 230 the higher is the degree of roughness which can be achieved. Hence, the roughening process may be carried out as a "foam roughening method" in which the roughening is achieved in the presence of a gas bubble foam of the electrolyte 330. Optionally, a foaming agent may be added to the electrolyte 230 to increase foam formation.

FIG. 5 illustrates a further equipment 500 for electrochemical roughening a metallization layer surface on a semiconductor wafer. The equipment 500 includes an electrolytic bath 330 as previously described, and reference is made to the above description in order to avoid reiteration. The equipment 500 may further include one or more holders 510, 520 for suspending a plurality of semiconductor wafers 210, 220 in the electrolytic bath 330. For instance, a number of equal to or greater than N wafers 210, 220 may be processed simultaneously, with N being an integer equal to or greater than, e.g., 2, 4, 8, 10, . . . , while in the example of FIG. 5 there is N=8.

As illustrated in FIG. 5, the equipment 500 may be symmetrical in terms of the anode/cathode reaction and/or the placement of the semiconductor wafers 210, 220 and/or the generation of gas bubble streams in the presence of the semiconductor wafers 210, 220. Hence, the equipment 500 may include a second gas bubble generator 550 which may be positioned beneath the semiconductor wafer(s) 210. The second gas bubble generator 550 is configured to treat the metallization layer on the further wafer(s) 210 with gas bubbles 260 during electrochemical roughening. The second gas bubble generator 550 may be designed the same way as described above for the first gas bubble generator 350.

Further, a stirrer 560 may be provided in the electrolytic bath 330 for moving and intermixing the electrolyte 230.

In FIG. 5 and throughout all examples, the entire electrochemical roughening process may be performed in a material-neutral way, i.e. without loss of metal material at the electrodes (in FIG. 5 the wafer(s) 210 and wafer(s) 220). In total, no metal ions may be removed from the electrolyte 230, since the rate of the metal-depleting anode reaction and the rate of the metal-depositing cathode reaction may be the same. That way, the roughening processes described herein may provide for a high homogeneity of roughness which can be obtained without any loss of metallization layer material. These conditions are usually not met by conventional roughening processes which rely on chemical etching or laser treatment. Further, surface functionalization as described above is not available by such conventional approaches.

Figure 6:
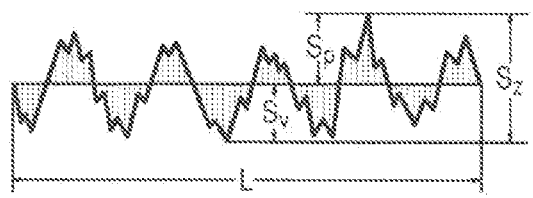
FIG. 6 is a diagram illustrating an exemplary cross-sectional surface profile having a certain roughness and parameters indicative of the roughness.

FIG. 6 is a diagram illustrating the surface profile of a metallization layer having a certain roughness. The surface profile is depicted versus a sample length L. Sz denotes the maximum height of the surface profile. Sp denotes the maximum height of the peaks of the surface profile. Sv denotes the maximum height of valleys of the surface profile.

Figure 7:
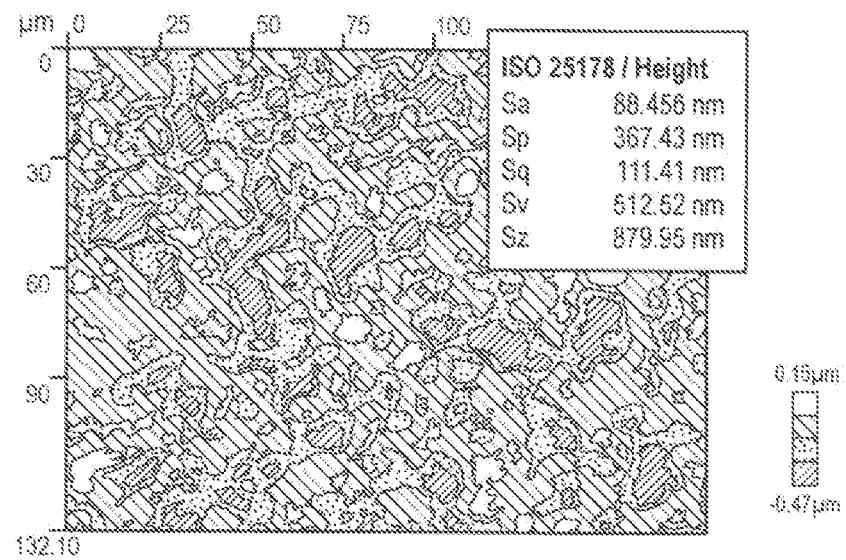
FIG. 7 is a plan view image of a metallization layer surface in which the surface roughness is illustrated by greyscale and represented by parameters as set out in FIG. 6.

FIG. 7 illustrates an exemplary greyscale image of the surface roughness of a Cu metallization layer prior to the roughening treatment as described herein. The following parameters in accordance with the standard ISO 25178 (Geometric Product Specifications—Surface Texture) were measured:

Sa=88.456 nm,
Sp=367.43 nm,
Sq=111.41 nm,
Sv=512.52 nm and
Sz=879.95 nm.

Sa is the arithmetic mean height of the surface profile. Sq is the root mean square height of the surface profile.

As known in the art, Sq may be used as a measure of surface roughness. That is, the greater the value of Sq the rougher is the surface.

The initial roughness can be greatly enhanced by the metallization layer surface roughening process described herein. According to one example, a Cu metallization layer was applied to a wafer and the following height parameters were measured in accordance with ISO 25178:

Sa=33.8 nm,
Sq=65.3 nm,
Sz=23435 nm,
Sp=2849 nm,
Sv=20586 nm,
Ssk=−15.1, and
Sku=7282.

According to ISO 25178, Ssk denotes the skewness of the surface and Sku denotes the kurtosis of the surface.

After a roughening treatment of the metallization layer using a voltage of 5 V, a polarity reversal time of T=20 s and a number of C=10 cycles, the following roughness parameters were obtained:

Sa=494 nm,
Sq=622 nm,
Sz=21508 nm,
Sp=3919 nm,
Sv=17589 nm,
Ssk=0.0394, and
Sku=3.60.

As may be seen from a comparison of Sq prior to and after the roughening treatment, the exemplary roughening process enhanced the roughness of the Cu surface nearly by a factor of 10.

Neither such enhancement of roughness nor the absolute values of the parameters (in particular of Sq) disclosed herein are known to be achieved by conventional roughening treatments available in the art.

Figure 8:
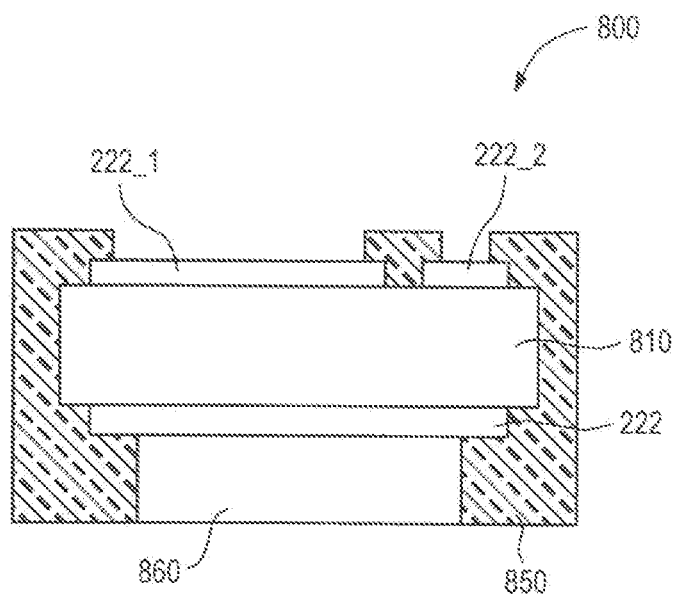
FIG. 8 is an exemplary semiconductor package including a semiconductor die having a roughened metallization layer surface and an encapsulation embedding at least partially the semiconductor die and the roughened metallization layer surface.

FIG. 8 illustrates an exemplary semiconductor package 800. The semiconductor package 800 includes a semiconductor die 810 having at least one metallization layer 222. The semiconductor package 800 further includes an encapsulation 850 embedding at least partially the semiconductor die 810 and the roughened surface of the metallization layer 222. The roughened surface of the metallization layer 222 has a roughness of a route means square height (Sq) of equal to or greater than 300 nm, 400 nm, 500 nm, 600 nm, 700 nm, or 800 nm (in accordance with ISO 25178).

The semiconductor die 810 may be a power die, e.g. a die including one or more power transistors and/or one or more power diodes or other power ICs. The metallization layer 222 may, e.g., include a die backside metallization layer 222. The die backside metallization layer 222 may be a load electrode metallization layer of the power die 810, e.g. a drain electrode metallization layer or a source electrode metallization layer.

As illustrated in FIG. 8, the metallization layer 222 may optionally connect to a heat sink 860. The heat sink 860 may be exposed from the encapsulation 850. In other embodiments the metallization layer 222 may, e.g., form an external terminal of the semiconductor package 800 and may directly connect to external circuitries, e.g. to conducting traces on a PCB (printed circuit board).

The roughened surface of the metallization layer 222 may be confined to partial areas of the overall surface of the metallization layer 222, e.g. to areas in which the (roughened) surface of the metallization layer 222 directly engages with the encapsulation 850. In other words, in other areas, e.g. in the area where the heat sink 860 is connected to the metallization layer 222, the surface of the metallization layer 222 may have been kept smooth by, e.g., masking during the roughening process.

The semiconductor die 810 may further include other metallization layers which have also been at least partly roughened by any of the processes described herein. By way of example, the semiconductor die may be equipped with a first separated area of metallization layer 222_1 (e.g. a load electrode metallization layer 222_1) and a second separated area of metallization layer 2222 (e.g. a gate metallization layer 222_2). In other words, the metallization layer 222 may be separated in a plurality of disjointed metallization layer areas. Also, these metallization layers 222_1, 2222 may have been processed to have roughened surface areas at least in regions covered by the encapsulation 850.

Hence, the metallization layers 222 and/or 222_1 and/or 2222 may further comprise a smooth surface (e.g. in the central part of these metallization layers), wherein the roughness of the roughened surface is equal to or greater than 5, 7, 9 or 11 times the roughness of the smooth surface in terms of the root mean square height (Sq) of the respective surfaces.

Further, the semiconductor package 800 may include a roughened surface of a metallization layer 222 and/or 222_1 and/or 222_2, which may include metal oxide secondary products or metal halides secondary products. These secondary products are an unavoidable consequence of a functionalized metallization layer surface created by using either oxidizing or reducing gases during the roughening process.

The following examples pertain to further aspects of the disclosure:

Example 1 is a method of manufacturing a semiconductor wafer having a roughened metallization layer surface, the method comprising immersing the wafer in an electrolytic bath; generating gas bubbles in the electrolytic bath; and electrochemically roughening a surface of the metallization layer on the wafer in the presence of the gas bubbles by applying a reversing voltage between the metallization layer and an electrode of the electrolytic bath.

In Example 2, the subject matter of Example 1 can optionally include wherein the gas is an inert gas or an oxidizing gas or a reducing gas or a mixture of any of these gases.

In Example 3, the subject matter of Example 1 or 2 can optionally include wherein the gas bubbles are configured to form a temporary and statistically distributed micro-masking of an electrochemical dissolve and deposition process on the metallization layer surface.

In Example 4, the subject matter of any preceding Example can optionally include wherein the metallization layer is positioned in a region of the electrolytic bath where the gas bubbles render the electrolytic bath foamy.

In Example 5, the subject matter of any preceding Example can optionally include structuring the metallization layer into separated areas before immersing the wafer in the electrolytic bath, wherein the separated areas are electrically connected.

In Example 6, the subject matter of any preceding Example can optionally include masking certain areas of the metallization layer before immersing the wafer in the electrolytic bath so as to prevent roughening of the masked areas.

In Example 7, the subject matter of any preceding Example can optionally include wherein the reversing voltage between the metallization layer and the electrode of the electrolytic bath is applied over a number of cycles, wherein the cycle duration is equal to or greater than 5 s, 10 s, 20 s, 30 s, or 40 s and/or the number of cycles is equal to or greater than 5, 10, or 20.

In Example 8, the subject matter of any preceding Example can optionally include wherein the reversing voltage frequency is equal to or less than 1 Hz, 0.5 Hz, 0.2 Hz, 0.1 Hz, 0.05 Hz, or 0.02 Hz.

In Example 9, the subject matter of any preceding Example can optionally include wherein the metallization layer is based on copper.

Example 10 is a semiconductor wafer metallization layer surface roughening equipment, including an electrolytic bath; a first electrode and a second electrode, the first electrode and the second electrode are configured to be connected to a reversing voltage, wherein at least one of the first electrode and the second electrode is a metallization layer on the wafer; and a first gas bubble generator configured to treat the metallization layer with gas bubbles during electrochemical roughening.

In Example 11, the subject matter of Example 10 can optionally include wherein the wafer is held inclined relative to a direction of movement of the gas bubbles in the electrolytic bath.

In Example 12, the subject matter of Example 10 or 11 can optionally include wherein the first electrode and the second electrode are each metallization layers on different wafers, further comprising: a second gas bubble generator configured to treat the metallization layer on the further wafer with gas bubbles during electrochemical roughening.

Example 13 is a semiconductor package, including a semiconductor die having a metallization layer, the metallization layer comprising a roughened surface; and an encapsulation embedding at least partially the semiconductor die and the roughened surface of the metallization layer, wherein the roughened surface has a roughness of a root mean square height of equal to or greater than 300 nm, 400 nm, 500 nm, 600 nm, 700 nm, or 800 nm.

In Example 14, the subject matter of Example 13 can optionally include wherein the subject matter of any one of Examples 9 to 11 can optionally include wherein the metallization layer further includes a smooth surface, and wherein the roughness of the roughened surface is equal to or greater than 5, 7, 9, or 11 times the roughness of the smooth surface in terms of the root mean square height of the respective surfaces.

In Example 15, the subject matter of Example 13 or 14 can optionally include wherein the semiconductor die is a power die and the metallization layer comprises a power die backside metallization layer and/or a load electrode metallization layer of the power die.

In Example 16, the subject matter of any of Examples 13 to 15 can optionally include wherein the roughened surface comprises metal oxide secondary products or metal halides secondary products.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor wafer having a roughened metallization layer surface, the method comprising:
    immersing the semiconductor wafer in an electrolytic bath;
    generating gas bubbles in the electrolytic bath; and
    electrochemically roughening a surface of a metallization layer on the semiconductor wafer in the presence of the gas bubbles by applying a reversing voltage between the metallization layer and an electrode of the electrolytic bath.

2. The method of claim 1, wherein the gas bubbles are generated from an inert gas or an oxidizing gas or a reducing gas or a mixture of any of these gases.

3. The method of claim 1, wherein the gas bubbles are configured to form a temporary and statistically distributed micro-masking of an electrochemical dissolve and deposition process on the surface of the metallization layer.

4. The method of claim 1, wherein the metallization layer is positioned in a region of the electrolytic bath where the gas bubbles render the electrolytic bath foamy.

5. The method of claim 1, further comprising:
    structuring the metallization layer into separated areas before immersing the semiconductor wafer in the electrolytic bath, wherein the separated areas are electrically connected.

6. The method of claim 1, further comprising:
    masking certain areas of the metallization layer before immersing the semiconductor wafer in the electrolytic bath so as to prevent roughening of the masked areas.

7. The method of claim 1, wherein the reversing voltage between the metallization layer and the electrode of the electrolytic bath is applied over a number of cycles, wherein the cycle duration is equal to or greater than 5 s, 10 s, 20 s, 30 s, or 40 s and/or the number of cycles is equal to or greater than 5, 10, or 20.

8. The method of claim 1, wherein a frequency of the reversing voltage is equal to or less than 1 Hz, 0.5 Hz, 0.2 Hz, 0.1 Hz, 0.05 Hz, or 0.02 Hz.

9. The method of claim 1, wherein the metallization layer is based on copper.

10. A semiconductor wafer metallization layer surface roughening equipment, comprising:
    an electrolytic bath;
    a first electrode and a second electrode, the first electrode and the second electrode are configured to be connected to a reversing voltage, wherein at least one of the first electrode and the second electrode is a metallization layer on a semiconductor wafer; and
    a first gas bubble generator configured to treat the metallization layer with gas bubbles during electrochemical roughening.

11. The semiconductor wafer metallization layer surface roughening equipment of claim 10, wherein the semiconductor wafer is held inclined relative to a direction of movement of the gas bubbles in the electrolytic bath.

12. The semiconductor wafer metallization layer surface roughening equipment of claim 10, wherein the first electrode and the second electrode are each metallization layers on different semiconductor wafers, further comprising:
    a second gas bubble generator configured to treat the metallization layer on the further semiconductor wafer with gas bubbles during electrochemical roughening.

* * * * *